(12) United States Patent
Roberg et al.

(10) Patent No.: US 7,825,719 B2
(45) Date of Patent: Nov. 2, 2010

(54) SYSTEM AND METHOD FOR WIDEBAND PHASE-ADJUSTABLE COMMON EXCITATION

(75) Inventors: Jeff Roberg, Longmont, CO (US); Steve Jordan, Berthoud, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 198 days.

(21) Appl. No.: 12/344,961

(22) Filed: Dec. 29, 2008

(65) Prior Publication Data

US 2010/0164561 A1 Jul. 1, 2010

(51) Int. Cl.
*G05F 1/10* (2006.01)
(52) U.S. Cl. .................................... 327/538; 327/530
(58) Field of Classification Search ................ 327/530, 327/538, 548
See application file for complete search history.

(56) References Cited

U.S. PATENT DOCUMENTS

| | | | |
|---|---|---|---|
| 5,889,429 A * | 3/1999 | Kobayashi et al. | 327/540 |
| 5,914,631 A * | 6/1999 | Soneda | 327/535 |
| 6,046,641 A | 4/2000 | Chawla | |
| 6,462,964 B2 | 10/2002 | Porter | |
| 6,545,450 B1 | 4/2003 | Ledenev | |
| 6,583,992 B2 | 6/2003 | Porter | |
| 6,590,786 B2 | 7/2003 | Gurov | |
| 6,667,651 B2 * | 12/2003 | Hashiguchi | 327/538 |
| 6,970,700 B1 | 11/2005 | Keane | |
| 7,206,210 B2 | 4/2007 | Harnett | |
| 7,319,358 B2 * | 1/2008 | Senthinathan et al. | 327/538 |
| 2003/0080817 A1 | 5/2003 | Ishii | |
| 2003/0117195 A1 | 6/2003 | Chang | |
| 2006/0232471 A1 | 10/2006 | Coumou | |
| 2006/0248138 A1 | 11/2006 | Tanaka | |
| 2006/0262889 A1 | 11/2006 | Kalvaitis | |
| 2007/0044715 A1 | 3/2007 | Blattner | |
| 2007/0145900 A1 | 6/2007 | Kirchmeier | |
| 2008/0048741 A1 | 2/2008 | Kim | |
| 2008/0105538 A1 | 5/2008 | Winterhalter | |
| 2008/0107142 A1 | 5/2008 | Glueck | |
| 2008/0179948 A1 | 7/2008 | Nagarkatti | |

FOREIGN PATENT DOCUMENTS

GB 2239996 7/1991

OTHER PUBLICATIONS

Geedipally, Avanthi, "International Search Report re PCT/US09/068310", Mar. 29, 2010, Published in: PCT.

* cited by examiner

*Primary Examiner*—Hai L Nguyen
(74) *Attorney, Agent, or Firm*—Neugeboren O'Dowd PC; Sean R. O'Dowd

(57) ABSTRACT

A power generator system and apparatus that uses a frequency synthesizer in conjunction with an oscillator to lock both frequency of a drive signal with a reference signal. The oscillator center frequency is different from the nominal generator frequency, and as a consequence a variety of reference frequencies may be supported. By using a frequency synthesizer, the oscillator frequency can be locked onto a frequency that is a ratio of the reference frequency. Then, the frequency synthesizer may generate a drive signal that is closely matched to the reference frequency.

20 Claims, 5 Drawing Sheets

SYSTEM AND METHOD FOR WIDEBAND PHASE-ADJUSTABLE COMMON EXCITATION

FIELD

This disclosure relates generally to power generators. More particularly, it relates to systems and methods for locking a drive signal of a generator with a reference signal.

BACKGROUND

In generator applications, including without limitation, manufacturing of semiconductor devices, a common reference signal, also known as a common exciter (CEX) may be used to synchronize two or more generators (e.g., R.F. generators). Typical implementations of the CEX feature include a phase locked loop (PLL) using a voltage-controlled oscillator (VCO) to generate the drive signal, where the center frequency of the VCO coincides with the nominal frequency of the generator, and the phase of the VCO is locked using a phase detector.

SUMMARY

Exemplary embodiments disclosed in the present application are summarized below. These and other embodiments are more fully described in the Detailed Description section. It is to be understood, however, that there is no intention to limit the claims of this application to the forms described in this Summary or in the Detailed Description. One skilled in the art can recognize that there are numerous modifications, equivalents and alternative constructions that fall within the spirit and scope of the present disclosure as expressed in the claims.

Many embodiments of the invention may be characterized as a power generator and method for locking a drive signal of the power generator. The method may include: initializing a common excitation mode of operation; measuring a frequency of a reference signal; calculating values for dividers of a plurality of frequency adjusters, calculating a frequency tune word for a frequency synthesizer, and calculating frequency calibration coefficients for frequency measurements; assessing whether the drive signal is synchronized with the reference signal; if the drive signal is not synchronized with the reference signal, then returning to measuring the frequency of the reference signal; if the drive signal is synchronized with the reference signal, then locking frequency and phase using a plurality of measurement/adjustment loops while operating in common excitation mode.

BRIEF DESCRIPTION OF THE DRAWINGS

Various objects and advantages and a more complete understanding of the present disclosure are apparent and more readily appreciated by reference to the following Detailed Description and to the appended claims when taken in conjunction with the accompanying Drawings, wherein:

DETAILED DESCRIPTION

Figure 1:
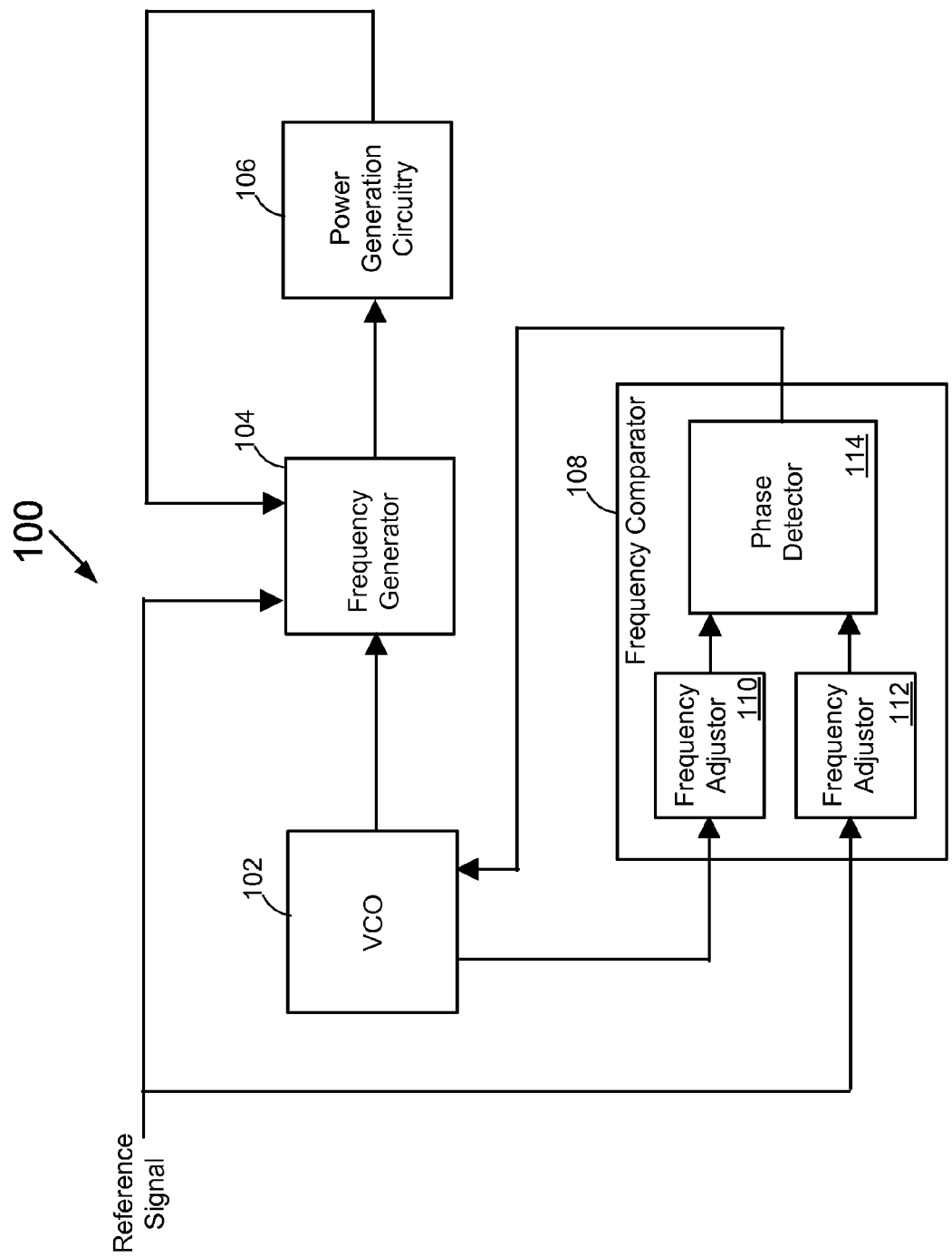
FIG. 1 is a block diagram depicting an exemplary embodiment of a power generator system employing novel features disclosed herein.

Referring now to the drawings, and referring in particular to FIG. 1, depicted is a block diagram of an embodiment of the disclosed power generator 100, including a control loop to synchronize a generated signal with that of a reference signal. The reference signal, in many embodiments. is supplied from an external source, which permits multiple generators to operate in a common excitation (CEX) mode, whereby all of the generators are driven with reference to the reference signal.

As depicted, the generator system 100 in the exemplary embodiment includes a voltage-controlled oscillator (VCO) 102 that is configured to receive an input voltage and to generate an output waveform having a frequency that varies in response to the received input voltage. The VCO 102 is coupled to a frequency generator 104 that generates a waveform based on an input signal that the frequency generator 104 receives from the VCO 102. The frequency generator 104 is coupled to power generation circuitry 106 that operates on the waveform it receives from the frequency generator 104 to deliver a power signal to a destination, such as a plasma chamber for example. As shown, the power signal is also fed back to the frequency generator 104. Additionally, the reference signal is supplied to the frequency generator 104.

A frequency comparator 108 is coupled to the VCO 102, and the frequency comparator 108 is configured to receive the output waveform from the VCO 102 and to receive the reference signal. The frequency comparator 108 is generally configured to provide an output that is based upon both the reference signal and the output of the VCO. In many embodiments for example, the frequency comparator 108 compare the reference signal with the output waveform from the process both of the signals to comparable frequencies such that the two reference signal and the output waveform from the VCO 102 may be compared. The difference between the two frequency-adjusted signals is then fed back to the VCO 102 to adjust the output frequency of the VCO 102.

Internal to the frequency comparator 108, in one embodiment, are two frequency adjusters 110 and 112 which operate on the output waveform of the VCO 102 and the reference signal, respectively. The frequency-adjusted signals are then delivered to a phase detector 114 that compares the difference between the two frequency-adjusted signals, which have been adjusted to operate at the same nominal frequency. One skilled in the art will readily appreciate that numerous alternative embodiments may be implemented to achieve the same results. In particular, a single frequency adjuster could be used instead of the two separate frequency adjusters 110 and 112 depicted in FIG. 1.

Figure 2:
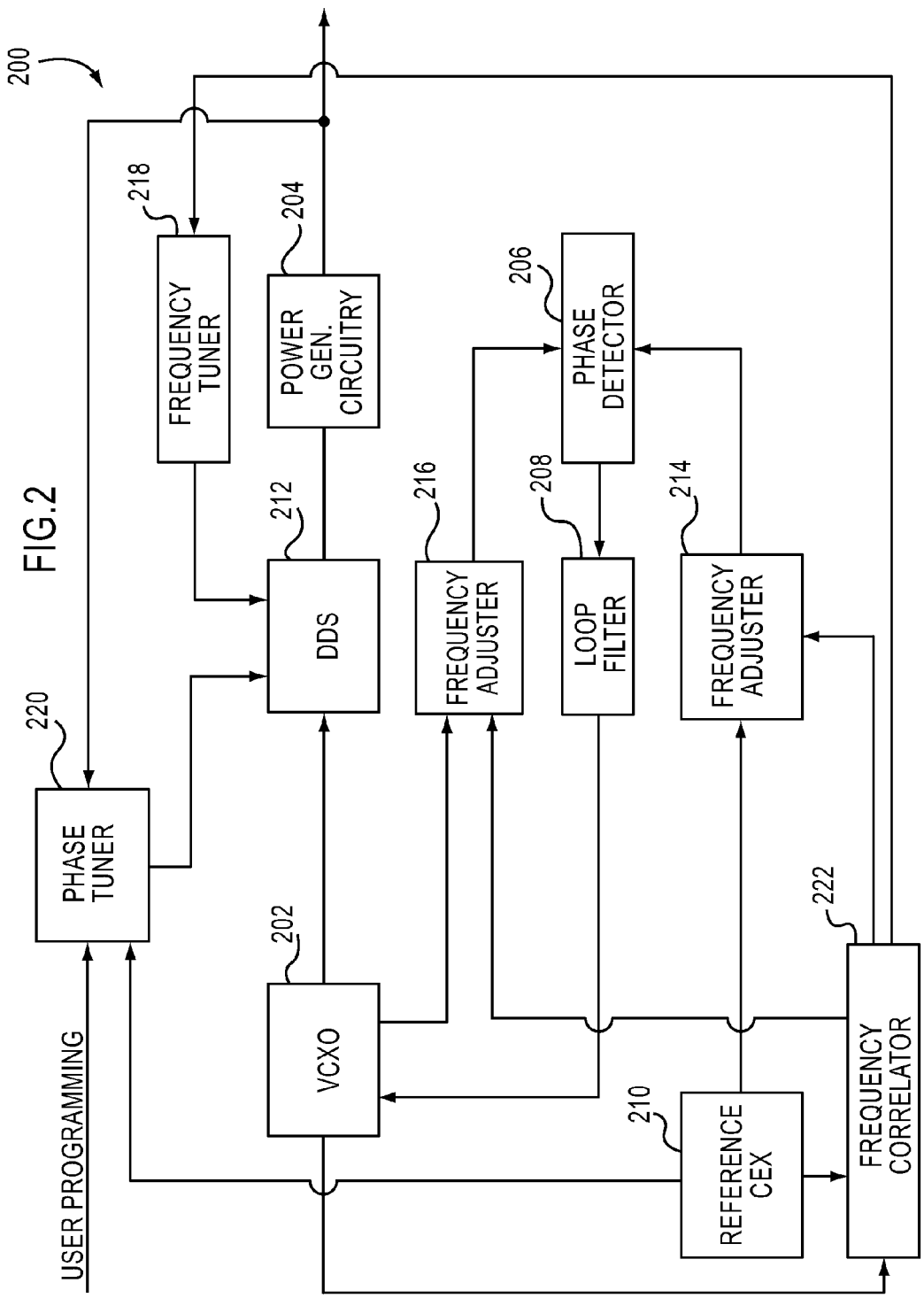
FIG. 2 is a block diagram depicting an exemplary embodiment of another power generator system employing novel features disclosed herein.

Referring now to FIG. 2, depicted is a block diagram of a power generator 200 (e.g., an RF, VHF, or mid frequency generator), which includes an oscillator (e.g., voltage-controlled crystal oscillator (VCXO)) 202 that is configured to receive an input voltage and to generate an output frequency in response to the input voltage. In many variations, a VCXO is used when the frequency of operation needs to be adjusted finely (e.g., during tracking, after pull-in).

The illustrated arrangement of these components is logical, and the depicted connections between the various components are exemplary only. It should also be recognized that the depiction of this embodiment is not meant to be an actual hardware diagram; thus, the components can be combined or further separated in an actual implementation, and the components can be connected in a variety of ways without changing the basic operation of the system. One of ordinary skill in the art will also appreciate that the functionality of the depicted components may be realized by hardware, firmware, software, or a combination thereof.

Coupled to the VCXO 202 is a direct digital synthesizer (DDS) 212, which generally functions to digitally create waveforms (e.g., arbitrary waveforms) and frequencies (e.g., from a single, fixed source frequency). In many variations the DDS 212 includes an electronic controller, a frequency reference, a counter (also referred to as a phase accumulator), a phase-to-output-waveform converter (random access memory in some embodiments), and a digital-to-analog converter (DAC). And in these variations, two operations may be carried put to make the DDS 212 work: programming and running.

In programming, the electronic controller may set the step size for the counter (phase accumulator) as well as the instantaneous offset for the counter. For embodiments with random access memory for the phase-to-output-waveform converter, the electronic controller can be used to fill the memory with data. In one embodiment, each datum is a binary word representing the amplitude of the signal at an instant of time. The array of data in the memory then forms a look-up table of amplitudes (e.g., for one period of the waveform), with time implied by the position in the look-up table. If, for example, the first half of the table were filled with zeroes and the second half with values of 100%, then the data would represent a square wave. Any other wave shape can be created simply by altering the data. In many embodiments of the DDS, random access memory is not provided and the phase-to-output-waveform conversion is fixed as a sinusoid.

In running, the phase accumulator may be instructed to advance by a certain increment on each pulse from the frequency reference. The sum of the phase accumulator output and instantaneous phase offset (the phase) is used to select the indexed item in the data table. Finally, the DAC converts this sequence of data to an analog waveform.

In many variations, to generate a periodic waveform, one pass through the table takes a time equal to the period of the waveform. For example, if the reference frequency is 1 MHz, and the table contains 1000 entries, then a complete pass through the table with a phase increment of 1 will take 1000/1 MHz=1 ms, so the frequency of the output waveform will be 1/(1 ms)=1 kHz. As a consequence, a higher output frequency may be generated by simply by increasing the phase increment so that the counter runs through the table more quickly.

In the example above, the phase increment is equal to 1, so the next possible frequency is obtained by setting the increment to 2, resulting in a doubling of output frequency. To obtain a finer control of frequency than this, the standard phase increment can be set to, for example, 10. This then allows slightly higher or lower output frequencies. For example, increasing the increment to 11 would increase the output frequency by 10%, and reducing it to 9 would decrease the output frequency by the same proportion.

In many implementations, the more precision that is required over the frequency, the greater the number of bits are needed in the counter. Practical implementations may set the size of both the counter (phase accumulator) and phase-to-output-waveform converter (lookup table in some embodiments) to be a power of 2. And the size of the counter may set the frequency resolution and the size of the phase-to-output-waveform converter may set the resolution of the output. Practical implementations may set the counter size as 32 bits and the output-waveform size as 14 bits. When the output size is less than the counter size, the lower bits of the counter may be truncated in order to create the output waveform. Truncation of the lower bits contributes to quantization noise on the output. The source frequency may be derived from a crystal of 1 MHz to 1000 MHz. Prior to the digital/analog converter, the highest output frequency may be limited to the Nyquist frequency of reference-clock/2. In some implementations, this frequency can also be output from an ideal D/A converter (DAC), but the frequency may be limited to a lower value due to practical limitations of the DAC. The DAC output may also include images at frequencies higher than the Nyquist frequency which may be used in some implementations.

Referring still to FIG. 2, the DDS 212 is in the exemplary embodiment is coupled to the power generation component 204 that operates on the signal it receives from the DDS 212 to deliver an output power signal to a destination, such as a plasma chamber for example. As depicted in this embodiment, the output signal from the power generation circuitry 204 may also branch (e.g., through the destination and sensor(s) in some embodiments) to a phase tuner 220, which is coupled to the DDS 212.

As depicted, a common exciter reference signal generator (CEX) 210 generates a reference signal that is coupled to a frequency adjuster 214 which, in turn, is coupled to a phase detector 206. The common exciter reference signal generator (CEX) 210 may be outside the generator, with functionality in the generator disposed to receive the reference signal from an external common-excitation reference signal generator. As shown, in the exemplary embodiment, the phase detector 206 is coupled to a loop filter 208, and the output of the loop filter 208 is a control signal (e.g., including a dc voltage), which is coupled to the VCXO 202. The reference signal generator 210 is also coupled to the phase tuner 220 and to a frequency correlator 222.

A frequency adjuster 216 is coupled between the VCXO 202 and the phase detector 206, with an adjustment control input coupled from the frequency correlator 222. The frequency correlator 222 is coupled from the VCXO 202 and the reference CEX 210, and is coupled to a frequency tuner 218 as well as two frequency adjusters 214 and 216. The frequency tuner 218 is coupled to the DDS 212.

Figure 3:
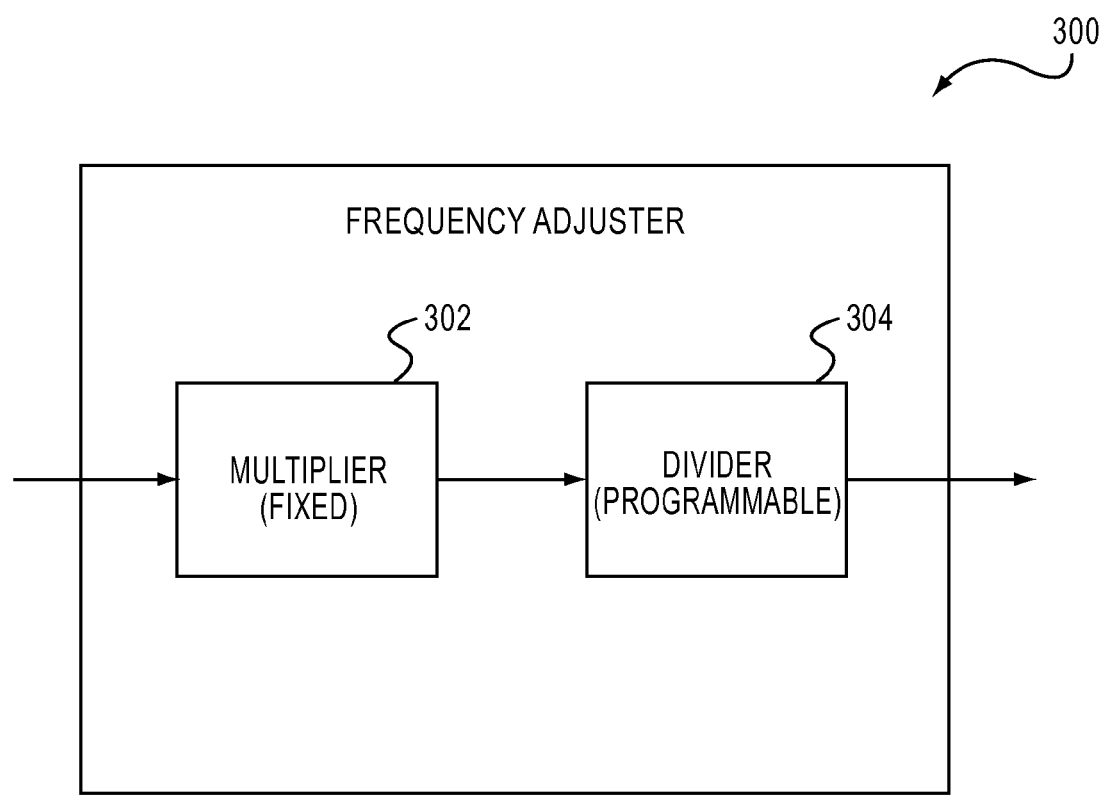
FIG. 3. is a block diagram depicting the functional structure and operation of an exemplary frequency adjuster.

Referring briefly to FIG. 3, depicted is a functional block diagram of a frequency adjuster 300, which may be used to realize the frequency adjusters 214 and 216 depicted in FIG. 2. As shown, the frequency adjuster 300 comprises a fixed multiplier 302 and a variable divider 304.

Referring again to FIG. 2, in operation, the DDS 212 is used in conjunction with the VCXO 202 which allows the center frequency of the VCXO 202 to be different from the nominal generator frequency, and which allows any CEX 210 frequency to be supported. The frequency of the VCXO 202 can be locked to a frequency that is close to the frequency of the signal generated by the CEX 210, times a ratio, m/n, where m and n are integer values. (Frequency adjusters 214 and 216 perform the ratio multiplications in this embodiment.) Then, by using the DDS 212 that is clocked by the signal generated from the VCXO 202, the frequency of the drive signal can be closely matched to the reference signal generated by the CEX 210.

By way of illustration, and without limitation, an example is presented to help illustrate the operation of the generator described with reference to FIG. 2. For this example, it is assumed that the VCXO 202 has a center frequency of 27 MHz, and the reference frequency of the CEX 210 is 13.56 MHz.

In the present example, the frequency adjuster 214 includes the fixed multiplier 302 depicted in FIG. 3 that is fixed at an integer value of 13. Frequency adjuster 214 also comprises the variable divider 304 that is set to an integer value of 2744. The reference 10 includes a reference signal at a frequency of 13.56 MHz.

The reference signal enters the frequency adjuster 214 where the reference signal is first multiplied by the integer 13 (by the fixed multiplier 302 of the frequency adjuster 214) and then is divided by the integer 2744 (e.g., by the programmable divider 304 of the frequency adjuster 214) to yield a signal having the frequency of 64.2419825 kHz.

Similarly, for this illustrative example, frequency adjuster 216 comprises a fixed multiplier 302 that is fixed at an integer value of 7, and a variable divider 304 that is set to an integer value of 2942. The VCXO 202 generates a signal at a frequency of 27 MHz, which then enters the frequency adjuster 216 where it is first multiplied by the integer 7 (by the fixed multiplier 302 of the frequency adjuster 216) and then is divided by the integer 2942 (e.g., by the programmable divider 304 of the frequency adjuster 216) to yield a signal having the frequency of 64.2420122 kHz.

The difference in frequencies between the output signals of frequency adjusters 214 and 216 causes a phase error which is detected in the phase detector 206. A difference signal then flows to the loop filter 208, and the loop filter 208 transmits a control signal to the VCXO 202 to adjust the output frequency of the VCXO 202, so that the phase error is reduced (e.g., eliminated). When the phase error is substantially eliminated, the frequency of the output signals of frequency adjusters 214 and 216 will be substantially identical. For this example, the VCXO clock frequency while locked will be 26.9999875 MHz (64.2419825 kHz times 2942 divided by 7).

Continuing with the exemplary illustration, the DDS 212 comprises an internal clock multiplier (the integer value 14 in this example) so that its system clock is VCXO-CLK*14 (which equals 377.999825 MHz when the VCXO-CLK frequency is 26.9999875 MHz). The DDS 212 implements a 32-bit phase accumulator as follows: Phase(n)=modulo (phase(n−1)+freq_tuneword, 2^32). After implementation of the phase accumulator, the DDS 212 implements a sine lookup: sine(n)=sin(2*pi*phase(n)/2^32+offset$_{inst}$). Sine(n) is then written to the digital-to-analog converter (DAC) in the DDS 212. As described above, these three functional components (phase accumulator, sine lookup, and DAC) may be included in the structure and operation of the DDS 212.

As an example, without limitation, the DDS 212 clock period is 2645.5 ps with 378 MHz system clock. During one clock period, the phase of a 13.56 MHz sinusoid will advance 0.225 (2*pi*13.56/378) radians. This means that the frequency tune word, as set by the frequency tuner 218, would be set as 154073430 (2^32*0.225/(2*pi)). If the frequency tune word is set higher by the frequency tuner 218, then the phase accumulator will advance through the phase faster, so the frequency will increase. Likewise, if the tune word is set lower by the frequency tuner 218, the frequency will decrease.

Continuing with the exemplary illustration, the tune word for the DDS with system clock of 377.999825 MHz is calculated based on the adjustment values of frequency adjusters 214 and 216. The tune word is calculated based on the locked frequency. The locked frequency is equal to VCXO-freq times 7/2942 (based on frequency adjuster 216), divided by 13/2744 (based on frequency adjuster 214). As previously described, the DDS output frequency is VCXO-freq times 14, times the frequency tune word, divided by 2^32. By combining these two frequency relationships, the frequency tune word can be calculated as (2^32/14)*(7/2942)/(13/2744), which evaluates to 154073501. In this example, the VCXO frequency while locked is slightly below the center frequency, so the frequency tune word is slightly above the value that was calculated for the nominal center frequency. Referring again to FIG. 2, the frequency tuner 218 calculates the frequency tune word based on the frequency adjustment values as described in this paragraph. When the frequency tune word is calculated, the measurement system for the generator can be calibrated for the new frequency, based on precalculated calibration coefficients.

In one embodiment of measurement calibration, $V_{fwd\text{-}cal}=C1*V_{fwd\text{-}meas}+C2*V_{rfl\text{-}meas}$, while $V_{rfl\text{-}cal}=C3*V_{fwd\text{-}meas}+C4*V_{rfl\text{-}meas}$. In this example, C1/C2/C3/C4/$V_{fwd\text{-}meas}$/$V_{rfl\text{-}meas}$ all represent complex vectors, so there are eight separate coefficients (C1-real, C1-imag, etc). Each of the individual coefficients is calibrated using a polynomial based on the frequency delta. For example, using a $2^{nd}$-order polynomial, C1-real=$C1_0$+$C1_1$*(freq-freq$_{center}$)+$C1_2$*(freq-freq$_{center}$)$^2$. By measuring over a wide frequency range during calibration, the coefficients can be set to support a wide band of frequencies.

Referring to FIG. 2, the frequency correlator 222 calculates adjustment values to be used by frequency adjustors 214 and 216. The adjustment values {a, b, c, d} are selected to minimize the error between VCXO-freq*a/b and REF-CEX-freq*c/d, while limiting {a, b, c, d} values such that they can be supported in a practical implementation.

By way of illustration, and without limitation, an example is presented to help illustrate the calculation of the adjustment values performed by the frequency correlator 222. For this example, we assume the CEX 210 frequency has been measured with respect to the VCXO center frequency as 13.56 MHz. Also, it is assumed that a is fixed as 7 and c is fixed as 13, and that b is constrained to even numbers between 1536 and 3072 (inclusive). By setting 27*7/b=13.56*13/d, d can be calculated as (13.56/27)*(13/7)*b. Then d$_{integer/even}$ can be calculated as 2*round(d/2). By calculating an error (such as |(d−d$_{integer/even}$)/d$_{integer/even}$|) for each allowed value for d, the b and d values can be selected.

In order to reduce the time to calculate the adjustment values in the frequency correlator 222, an algorithm that is optimized for implementation in integrated circuits such as field programmable gate arrays (FPGAs) may be utilized. This algorithm avoids division, and although the algorithm is optimized for hardware implementation, it can also be implemented in software.

The algorithm is based on a frequency count (designated as X) taken over some number of periods of CEX/64 (N), and may be summarized in the following four steps as follows: (1). Initialize b at the midpoint of the valid range and d as 1; (2). calculate 64*N*b−d*X; (3). Increment b if result is negative, and decrement otherwise. Then calculate 64*N*b−d*X again, and if the sign of 64*N*b−d*X has changed or b is at the limit, proceed to step 4, otherwise, repeat step 3; (4). Record the minimum magnitude of the last two 64*N*b−d*X calculations as well as the b/d values that correspond to it, then increment d, initialize b at the midpoint, and proceed on to step 2 if d is still in range. Otherwise the calculation is complete.

In the optimized algorithm for calculation of the adjustment dividers, let V equal center frequency of VCXO and C equal the frequency of the CEX input. X is the number of cycles of V counted over N periods of C/64. The variables b and d are the dividers for VCXO and CEX respectively. The expression for frequency error is described as follows: freq. error (ratio)=abs[(C*b/(V*d))−1]. This can be further written as: abs[(C*b−V*d)/(V*d)]. If d is held constant, the corresponding value of b to minimize the expression can be found by minimizing the following: abs[C*b−V*d]. The value of X is related to V and C as follows: C/64=N/(X/V), which means that C=64*NV/X. Then, the following expression can be minimized with respect to b: abs[64*NV*b/X−V*d]. The expression can then be multiplied with X/V (constant), without affecting the value of b that will minimize the expression. Then, the expression can be written as follows: abs[64*N*b−d*X]. When holding d constant, this expression will transition from negative to positive as b is varied, and the transition occurs for the values closest to minimization of the overall function.

Figure 4:
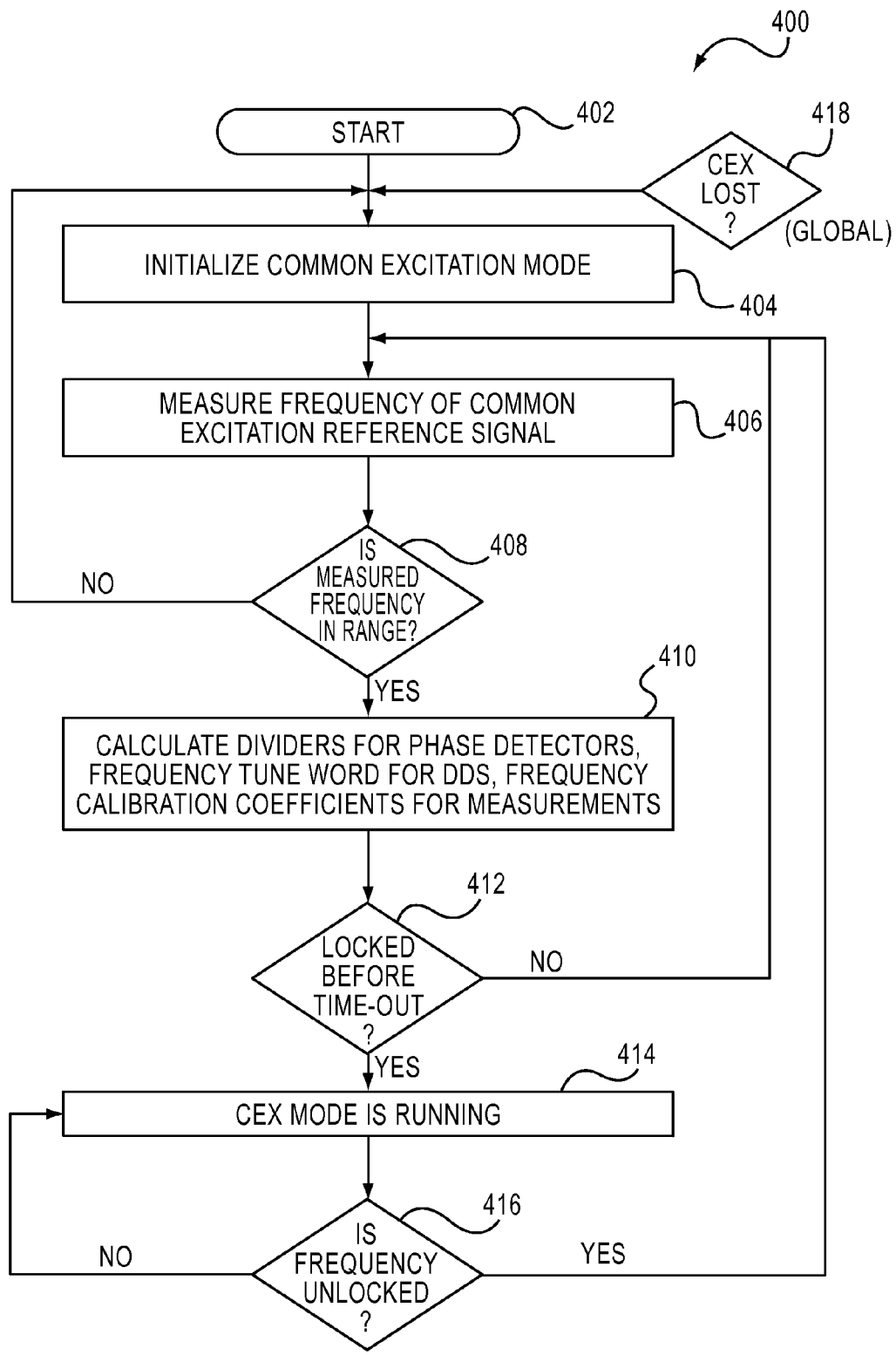
FIG. 4 is a flow diagram depicting a method that may be carried out in connection with the power generator system depicted in FIG. 2.

Referring now to FIG. 4, depicted is an exemplary method that may be carried out in connection with the power generator system depicted in FIG. 2. As shown, start-up begins at block 402, with initial conditions including the common excitation mode and the VCXO phase locked loop (PLL) disabled, and voltage control of the VCXO will be directed to cause the VCXO output to be centered.

Next, in block 404, common excitation mode is initialized. Then in block 406, the common excitation reference frequency is measured with respect to the VCXO clock frequency. Next, at block 408, a determination is made as to whether the measured frequency is within a predetermined range. The method returns to start-up conditions at block 402 if the measured frequency is not in range. If the measured frequency is in range, then the method progresses to block 410 to calculate dividers for the phase detector, to calculate an applicable frequency tune word for the DDS 212, and to calculate applicable frequency/calibration-coefficients to the measurement system, and set a "wait for lock" condition.

At branch 412, the process then waits for indication of lock with the common excitation reference signal, or for a programmable timer to expire, which ever comes first. If the CEX reference signal is locked, then the method transitions to the "CEX Running" mode at block 414. If the CEX is not locked, then the method returns to block 406 to measure the common excitation frequency again.

Referring to branch 416, if lock on the CEX input is lost, the process will return block 406 to measure the common excitation frequency again. Referring to global branch 418, if at any time the common excitation reference signal is lost, then, the method returns to block 404 to re-initialize the common excitation mode.

Another aspect of the disclosed implementation includes use of a phase tuner 220 to deliver a tune word to the DDS 212 to steer the generator's output phase based on the reference signal generated by the CEX 210. Separate loops are provided for frequency and phase, and this approach allows jitter and lock time to be reduced. This approach also allows the frequency and phase to remain locked (or close to lock) during pulsing of the output. The frequency remains locked because it does not depend on the output, and the phase remains locked (or close to lock) because phase error can only be accumulated based on a frequency error.

Figure 5:
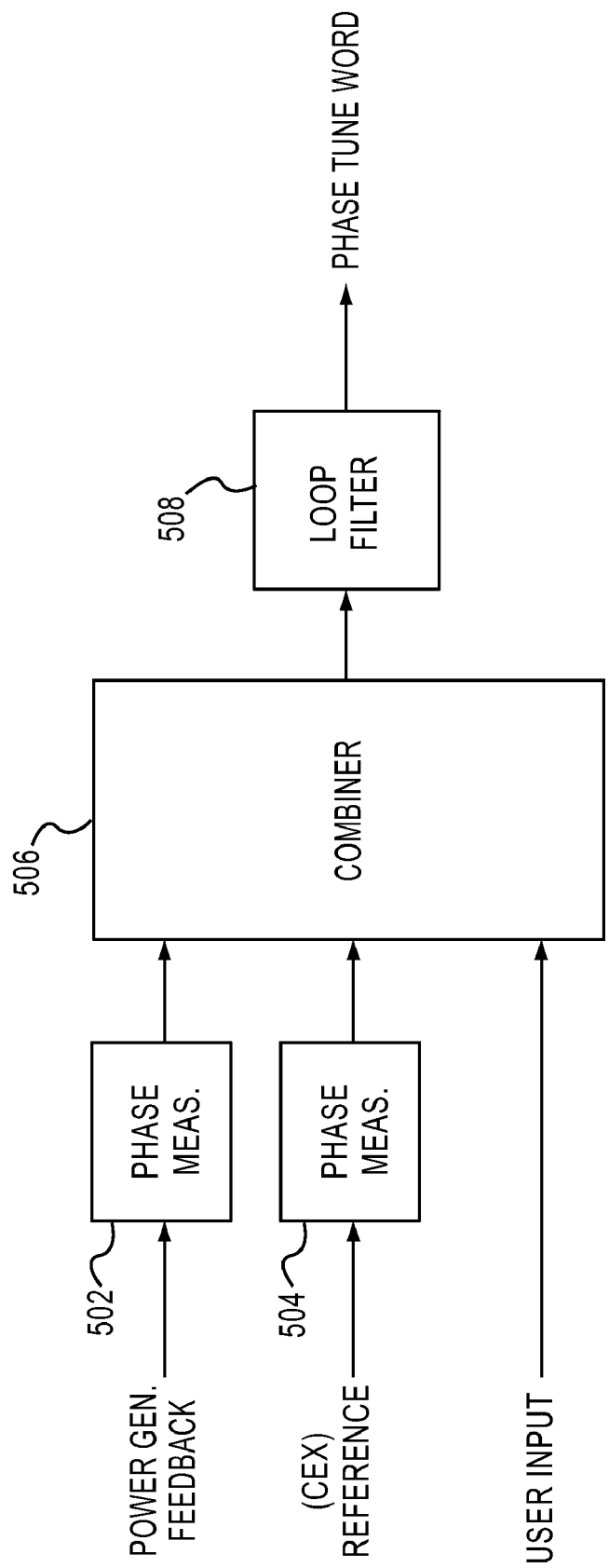
FIG. 5. is a block diagram depicting the functional structure and operation of an exemplary phase tuner.

Referring to FIG. 5, depicted is a functional block diagram of a phase tuner 500 that may be implemented to realize the phase tuner 220 in FIG. 2. Phase tuner 500 comprises two phase measurement devices 502 and 504 that measure the phase of the power feedback and CEX reference signals (e.g., with respect to an arbitrary reference). The combiner 506 receives a user programming input to identify a desired phase offset between the two phase measurements, and calculates the phase error by subtracting the phase measurements from the desired phase offset. A loop filter 508 provides the phase tune word output, typically by integrating a fraction of the phase error.

In many variations, the VCXO 202 is controlled so that frequency measurements of the CEX input (e.g., reference CEX 210) are made by the frequency correlator 222 with respect to the center frequency of the VCXO 202. This mitigates loss of pull-in/tracking range that may be caused by frequency inaccuracy of the VCXO.

In conclusion, the present disclosure provides, among other things, an apparatus, system and method for locking a drive signal of a power generator with a reference signal, with wide frequency pull-in range as well as programmable phase offset. Those skilled in the art can readily recognize that numerous variations and substitutions may be made in the embodiments disclosed herein, their uses and configurations to achieve substantially the same results as achieved by the embodiments described herein. Accordingly, there is no intention to limit the claims to the disclosed exemplary forms. Many variations, modifications and alternative constructions fall within the scope and spirit of the present disclosure as expressed in the claims.

What is claimed is:

1. A power generator capable of being driven by a reference signal having a predetermined frequency, the power generator comprising:
    a voltage-controlled oscillator configured to deliver a signal having a frequency that varies in response to a provided voltage signal;
    a frequency generator, coupled to the voltage-controlled oscillator, configured to receive the signal from the voltage-controlled oscillator, configured to receive the reference signal and to receive a power signal, the frequency generator further configured to generate a waveform that is delivered to drive a power generation circuit that generates the power signal;
    a frequency comparator, coupled to the voltage-controlled oscillator, configured to receive the reference signal and to receive the signal from the voltage-controlled oscillator, and also configured to adjust the frequencies of the reference signal and the signal delivered by the voltage-controlled oscillator, wherein the adjustments are made to correlate the reference signal and the signal from the voltage-controlled oscillator, and wherein the frequency comparator is also configured to detect differences in frequency between the frequency-adjusted signals of the voltage-controlled oscillator and the reference signal, and wherein the frequency comparator is also configured to deliver the provided voltage signal to the voltage-controlled oscillator.

2. The power generator of claim 1 wherein the voltage-controlled oscillator comprises a voltage-controlled crystal oscillator.

3. The power generator of claim 1 further comprising a loop filter, coupled between the frequency comparator and the voltage-controlled oscillator, configured to regulate the provided voltage signal to the voltage-controlled oscillator.

4. The power generator of claim 1 wherein the frequency comparator comprises a first frequency adjuster, a second frequency adjuster and a phase detector.

5. The power generator of claim 4 wherein the first frequency adjuster comprises a multiplier and a divider.

6. The power generator of claim 5 wherein the multiplier is configured to multiply a fixed value and the divider is configured to divide a variable value.

7. The power generator of claim 4 wherein the second frequency adjuster comprises a multiplier and a divider.

8. The power generator of claim 7 wherein the multiplier is configured to multiply by a fixed value and the divider is configured to divide by a variable value.

9. The power generator of claim 4 wherein the first frequency adjuster comprises a multiplier and a divider and wherein the second frequency adjuster comprises a multiplier and a divider.

10. The power generator of claim 9 wherein:
the multiplier of the first frequency adjuster is configured to multiply by a first fixed value;
the multiplier of the second frequency adjuster is configured to multiply by a second fixed value;
the divider of the first frequency adjuster is configured to divide by a first variable value; and
the divider of the second frequency adjuster is configured to divide by a second variable value.

11. The power generator of claim 9 wherein:
the multiplier of the first frequency adjuster is configured to multiply by a first value;
the multiplier of the second frequency adjuster is configured to multiply by a second value;
the divider of the first frequency adjuster is configured to divide by a third value; and
the divider of the second frequency adjuster is configured to divide by a fourth value.

12. The power generator of claim 1 wherein the frequency generator comprises a direct digital synthesizer.

13. The power generator of claim 12 further comprising:
a frequency tuner, coupled to the direct digital synthesizer, configured to control the frequency of the generated waveform, based on the reference signal;
a phase tuner, coupled to the direct digital synthesizer, configured to control the output phase of the generated waveform based on the reference signal and based on user input.

14. The power generator of claim 13, wherein the phase tuner is frozen during RF-off periods while the frequency tuner continually runs, such that common excitation can be maintained across pulses during pulsing of RF power.

15. The power generator of claim 1 wherein the frequency generator comprises a direct digital synthesizer and wherein the frequency comparator comprises a first frequency adjuster, a second frequency adjuster and a phase detector, the power generator further comprising:
a frequency correlator, coupled to the voltage-controlled oscillator and to the first and second frequency adjusters, the frequency correlator being configured to receive the reference signal and to receive the signal from the voltage-controlled oscillator, wherein the frequency correlator is configured to correlate the received signals and to generate a correlation signal;
a frequency tuner, coupled to the direct digital synthesizer, configured to receive the correlation signal, and configured to control the frequency of the generated waveform, based on the reference signal and the correlation signal; and
a phase tuner, coupled to the direct digital synthesizer and configured to receive the reference signal, to receive the power signal and to receive input from a user, the phase tuner also being configured to control the output phase of the generated waveform based on the reference signal, the power signal and the user input.

16. The power generator of claim 15 wherein the phase tuner comprises:
a first phase measurement device configured to measure the phase of the reference signal;
a second phase measurement device configured to measure the phase of the power signal;
a combiner, configured to receive the user input, and coupled to the first and second phase measurement devices; and
a loop filter coupled to the combiner.

17. A method for locking a drive signal of a power generator with a reference signal, the method comprising:
initializing a common excitation mode of operation;
measuring a frequency of a reference signal;
assessing whether the measured frequency of the reference signal is within a predetermined range of frequencies;
if the measured frequency is not within the predetermined range of frequencies, then re-initializing the common excitation mode of operation;
if the measured frequency is within the predetermined range of frequencies, then calculating values for dividers of a plurality of frequency adjusters, calculating a frequency tune word for a frequency synthesizer, and calculating frequency calibration coefficients for frequency measurements;
assessing whether the drive signal is synchronized with the reference signal;
if the drive signal is not synchronized with the reference signal, then returning to measuring the frequency of the reference signal;
if the drive signal is synchronized with the reference signal, then operating in common excitation mode.

18. The method of claim 17 further comprising re-initializing the common excitation mode of operation if the synchronization between the drive signal and the reference signal is lost.

19. The method of claim 18 wherein calculating values for dividers of a plurality of frequency adjusters further comprises selecting adjustment values to minimize an error between the measured reference signal and the drive signal.

20. The method of claim 17 wherein calculating a frequency tune word for a frequency synthesizer further comprises calculating frequency adjustor values based on a size of the frequency tune word and based on a ratio between a clock of the frequency synthesizer and a clock of a voltage-controlled oscillator.

* * * * *